(12) United States Patent
Belau et al.

(10) Patent No.: US 6,498,494 B2
(45) Date of Patent: Dec. 24, 2002

(54) DIAGNOSTIC CIRCUIT FOR MEASURING THE RESISTANCE AND THE LEAKAGE CURRENT OF AT LEAST ONE FIRING CAP OF A MOTOR VEHICLE OCCUPANT PROTECTION SYSTEM, AND A MOTOR VEHICLE OCCUPANT PROTECTION SYSTEM INCLUDING THE DIAGNOSTIC CIRCUIT

(75) Inventors: Horst Belau, Langquaid (DE); Stefan Hermann, Köfering (DE); Marten Swart, Obertraubling (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/803,429

(22) Filed: Mar. 9, 2001

(65) Prior Publication Data

US 2001/0052777 A1 Dec. 20, 2001

Related U.S. Application Data

(63) Continuation of application No. PCT/EP99/06666, filed on Sep. 9, 1999.

(30) Foreign Application Priority Data

Sep. 9, 1998 (EP) ............................................. 98117054

(51) Int. Cl.$^7$ ................................................ G01R 31/08
(52) U.S. Cl. ........................ 324/522; 324/502; 280/735; 180/282
(58) Field of Search ......................... 340/438; 280/735; 180/282; 324/502, 522, 525, 550

(56) References Cited

U.S. PATENT DOCUMENTS 5,640,095 A * 6/1997 Beier .......................... 324/522
5,666,065 A * 9/1997 Ravas ......................... 340/438
6,172,507 B1 * 1/2001 Hermann ..................... 324/502

FOREIGN PATENT DOCUMENTS

DE 196 38 393 * 12/1997

* cited by examiner

*Primary Examiner*—Christine Oda
(74) *Attorney, Agent, or Firm*—Laurence A. Greenberg; Werner H. Stemer; Gregory L. Mayback

(57) ABSTRACT

The resistance value and the leakage current of a load can be measured simultaneously. A load current is fed, mirrored by electrical power supplies (1, 3, 36), into a resistance measuring circuit (13, 30) and a leakage current measuring circuit (14 to 16). This permits rapid, precise measurement of a plurality of loads by a single measuring circuit connected via one multiplexer. The firing transistors can be distributed among different ASICs or provided jointly for a plurality of firing caps.

15 Claims, 6 Drawing Sheets

DIAGNOSTIC CIRCUIT FOR MEASURING THE RESISTANCE AND THE LEAKAGE CURRENT OF AT LEAST ONE FIRING CAP OF A MOTOR VEHICLE OCCUPANT PROTECTION SYSTEM, AND A MOTOR VEHICLE OCCUPANT PROTECTION SYSTEM INCLUDING THE DIAGNOSTIC CIRCUIT

CROSS-REFERENCE TO RELATED APPLICATION

This application is a continuation of copending International Application No. PCT/EP99/06666, filed Sep. 9, 1999, which designated the United States.

BACKGROUND OF THE INVENTION

Field of the Invention

The invention relates to a diagnostic circuit for measuring the resistance and the leakage current of at least one electrical load, specifically a firing cap of a motor vehicle restraint system. With such electrical loads in the form of firing caps, there is frequently a requirement to measure the resistance and the leakage current for diagnostic purposes in order to ensure correct functional capability of the firing caps. This diagnosis can be carried out at regular or irregular intervals, for example when the motor vehicle is started. If it is determined during the diagnosis that the firing cap resistance lies outside the permissible tolerance range and/or an unacceptable leakage current occurs, a fault message can be promptly output and/or the driving parameters (driver voltage, driver current, driving time) for driving the firing cap can be adapted if required.

During the diagnostic measurement, the firing cap resistance and the firing cap leakage current are usually measured one after the other. However, if a multiplicity of firing caps are provided, which is frequently the case in modern motor vehicle restraint systems, a long period of time is required to test all of the firing caps.

German Patent DE 196 38 393 C1 discloses a diagnostic circuit in which the firing cap that is to be tested is supplied by a power source which is driven in broadband fashion. The voltage drop across the firing cap is applied, using a switching element, to a correlator that is also supplied in broadband fashion. In order to measure leaks, further separate power sources may be provided for measuring leakage currents to ground or battery voltage.

U.S. Pat. No. 5,640,095 describes a circuit for testing the leakage resistance of a switching point, in which a test current is fed into the switching point and the voltage occurring at the switching point is detected. In order to perform a bipolar leakage resistance measurement, two measuring currents in opposite directions can be fed into the switching point.

Published European Patent Application EP-A 0 486 114 discloses an apparatus for testing an electrical circuit with respect to the leakage current and the continuity. The circuit is part of a bridge circuit whose branches are supplied with identical currents. To detect the leakage current, the bridge voltage is evaluated.

SUMMARY OF THE INVENTION

It is accordingly an object of the invention to provide a diagnostic circuit for measuring the resistance and the leakage current of at least one firing cap which overcomes the above-mentioned disadvantageous of the prior art apparatus of this general type. In particular, it is an object to provide a diagnostic circuit that enables a precise diagnosis to be carried out quickly.

With the foregoing and other objects in view there is provided, in accordance with the invention, a diagnostic circuit for measuring resistance and leakage current for at least one firing cap of a motor vehicle occupant protection system. The diagnostic circuit includes: a terminal for receiving a reference potential; at least one load having two terminals, one of the two terminals of the at least one load connected to the terminal for receiving a reference potential; an activation circuit for feeding a current to the at least one load during a diagnostic measurement; a resistance measuring circuit for determining a resistance of the at least one load; a leakage current measuring circuit for determining a leakage current that may be flowing during the diagnostic measurement, the leakage current measuring circuit configured to measure a difference between the current fed to the at least one load by the activation circuit and a current flowing from the at least one load to the terminal for receiving a reference potential; and a plurality of electrical power supplies connected to the leakage current measuring circuit and to the two terminals of the at least one load.

In the diagnostic circuit, the electrical resistance of the at least one load, in particular of the firing cap, and the leakage current are measured by detection circuits which are preferably at least partially embodied separately. These measurements can be carried out simultaneously. The time interval which is required overall for measuring the resistance and leakage current is thus extremely short. In particular, if a multiplicity of loads are to be tested, for example, if more than 10 firing cap circuits, are present, the overall diagnostic time interval required can be shortened drastically. During the simultaneous determination of leakage currents, the resistance measurement result based on a current measurement can additionally be corrected immediately taking into account the leakage current, with the result that the measuring accuracy is increased.

The leakage current measurement can be determined easily by forming a difference between the current supplied on the input side and the current measured on the output side. This differential current is preferably detected by a resistive voltage divider which generates a voltage representing the leakage current at its tap. Here, two electrical power supplies which are connected to one another and which simulate the current supplied to the firing cap or flowing out of the firing cap are provided. A connection point between these electrical power supplies can be connected to the leakage current measuring circuit, preferably to the resistance voltage divider. The resistive voltage divider ensures that the measuring current occurring at the connection point lies between the reference voltages applied to the resistive voltage divider and increases or decreases depending on the direction of the leakage current. Instead of a resistive voltage divider, it is, however, also possible to provide a single resistor which is connected to ground, for example. In this case, the leakage current measuring circuit changes it's polarity depending on the direction of the leakage current.

In accordance with an added feature of the invention, a voltage regulator that regulates the voltage occurring at a load terminal to a specific value is connected to one of the electrical power supplies. In this way, the current and voltage conditions at the load are permanently predefined and the electrical power supply connected to this terminal is controlled, in contrast to the electrical power supply connected to the other load terminal, by an impressed voltage and not by an impressed current.

In accordance with an additional feature of the invention, the voltage is variable, with the result that, for example, it is possible to repeat leakage current measurements with different potential values. In this way, leakage resistances to potential values between ground and the supply voltage are reliably detected.

In accordance with an another feature of the invention, the diagnostic circuit is used in vehicle occupant protection systems for motor vehicles, in particular airbag systems. The diagnostic circuit can be integrated directly into the control unit of the restraint system. This permits rapid diagnosis with short transient recovery times.

In accordance with a further feature of the invention, an electrical power supply (current mirror circuit) is provided which exactly simulates or which provides a fixed proportion of the current flowing through the firing cap during the diagnosis. The current is preferably impressed by a power source, and conducts it to the resistance measuring circuit and leakage current measuring circuit via separate terminals. This permits current measurement without affecting and falsifying the current which is actually flowing through the firing cap. Reciprocally, undesired effects occurring during the measurement of the resistance and leakage current can also be prevented by the electrical power supply terminals.

In accordance with a further added feature of the invention, the currents supplied to the resistance measuring circuit and the leakage current measuring circuit correspond to just a fraction, for example a tenth, of the current supplied to the firing cap. In this way, on the one hand, it can be ensured that the firing cap is supplied with current sufficient for reliable diagnosis, and on the other hand, that only small currents have to be coped with during the evaluation. These low currents additionally ensure that the power drain is low and that there is no excessive thermal loading of the evaluation circuit. In addition, only low currents have to be built up and switched. In particular, when a multiplexer which is preferably of analog design is used, and there is a time-selective measurement of a multiplicity of firing caps, the power consumption is greatly reduced.

In accordance with a further additional feature of the invention, the resistance of the firing cap is measured by separately measuring the current flowing through the firing cap. The current is preferably simulated by the electrical power supply, and by voltage drop occurring across the firing cap during this process.

In accordance with yet an added feature of the invention, different currents are generated for the resistance and leakage current measurements. The leakage current is preferably measured with only the lower current strength, because undesired power losses become particularly clearly apparent then.

In accordance with yet an additional feature of the invention, there is preferably one multiplexer for switching between different loads. Consequently, in each case, just one of the resistance and leakage current detection components has to be provided, which not only reduces the expenditure on circuitry, but also ensures identical measuring conditions, sensitivity, measuring tolerances etc. and permits the system to be extended as desired. Standardization, too, only has to be carried out once.

In accordance with yet a further feature of the invention, precise resistance measurement with leakage current compensation and/or offset compensation can be carried out by duplicating the measurement with different current strengths and forming the difference between the measured results.

In accordance with yet another feature of the invention, a multiplicity of loads, in particular firing caps, can be measured using the same resistance and leakage current measuring circuit components. The multiplexer is configured in particular as an analog multiplexer and has switches which are connected in series with the individual firing caps so that individual testing of the firing caps can be carried out successively. The voltage drops across the firing caps are preferably measured by a voltage detector, for example an operational amplifier. This operational amplifier is also preferably connected via switches of the multiplexer to the terminals of all of the loads which are to be tested. This gives rise to a somewhat higher expenditure for switches than would be the case if the operational amplifier were directly connected to the electrical power supply terminals of the multiplexer switches that are connected in series with the loads. Another possibility would then be implemented without additional switches. However, with this circuitry it is then possible to measure the load voltage directly in a precise way without any errors as a result of voltage drops at the multiplexer switches connected in series to the loads. Preferably, additional diodes are provided between the operational amplifier and the loads, through which diodes the undesired effects due to back currents or the like are prevented.

In accordance with yet another added feature of the invention, the voltage regulator, if one is present, is connected directly to a terminal of the voltage detector. The voltage regulator is consequently connected, via the multiplexer switch which has just closed, to one of the terminals of the firing cap which has just been measured, with the result that the potential occurring there is regulated.

In accordance with yet another additional feature, the invention can be used for all electrical loads in which the resistance (impedance) and the leakage current are to be measured. It is suitable, and is designed, in particular for firing cap diagnosis of a multiplicity of firing circuits for firing caps. In that case, it is possible to perform very rapid diagnostic measurement with short transient recovery times while at the same time providing the possibility of measuring leakage currents and firing cap resistances. It is possible to use a multiplexer which is of simple design and can be controlled in an analog fashion. The requirements placed on the analog multiplexers in terms of circuitry and control are very low because only a small number of switches are required per firing cap (four switches per firing cap). The other circuit components can be used jointly to carry out all of the diagnostic measurements and therefore, only one of them has to be provided. The invention can also be embodied in the form of an integrated circuit and in this case requires only a small silicon area.

With the foregoing and other objects in view there is provided, in accordance with the invention, a motor vehicle occupant protection system that includes: a terminal for receiving a reference potential; at least one load having two terminals, one of the two terminals of the at least one load connected to the terminal for receiving a reference potential; an activation circuit for feeding a current to the at least one load during a diagnostic measurement; a resistance measuring circuit for determining a resistance of the at least one load; a leakage current measuring circuit for determining a leakage current that may be flowing during the diagnostic measurement, the leakage current measuring circuit configured to measure a difference between the current fed to the at least one load by the activation circuit and a current flowing from the at least one load to the terminal for receiving a reference potential; a plurality of electrical power supplies connected to the leakage current measuring circuit and to the two terminals of the at least one load; a first integrated circuit including a first plurality of switching elements; and a second integrated circuit including a second plurality of switching elements. The at least one load includes a plurality of firing caps. Each one of the plurality of firing caps is connected between a respective one of the first plurality of the switching elements and a respective one of the second plurality of the switching elements. Each one of the plurality of firing caps is connected to fire when the respective one of the first plurality of the switching elements and the respective one of the second plurality of the switching elements are closed.

When the firing transistor pairs are distributed between different chips, the vehicle occupant protection system has a high level of operational reliability.

With the foregoing and other objects in view there is provided, in accordance with the invention, a motor vehicle occupant protection system that includes: a terminal for receiving a reference potential; at least one load having two terminals, one of the two terminals of the at least one load connected to the terminal for receiving a reference potential; an activation circuit for feeding a current to the at least one load during a diagnostic measurement; a resistance measuring circuit for determining a resistance of the at least one load; a leakage current measuring circuit for determining a leakage current that may be flowing during the diagnostic measurement, the leakage current measuring circuit configured to measure a difference between the current fed to the at least one load by the activation circuit and a current flowing from the at least one load to the terminal for receiving a reference potential; a plurality of electrical power supplies connected to the leakage current measuring circuit and to the two terminals of the at least one load; a first integrated circuit including a first plurality of switching elements; a second integrated circuit including a second plurality of switching elements; a common switching element; and a plurality of switching elements. The at least one load includes a plurality of firing caps. Each one of the plurality of the firing caps has a first terminal and a second terminal. The first terminals of at least some of the plurality of the firing caps are connected together and are driven by the common switching element. Each one of the second terminals of the at least some of the plurality of the switching elements are individually connected to a respective one of the plurality of the switching elements.

The vehicle occupant protection system can fire the caps utilizing a reduced number of firing transistors and leads, but at the same time can provide for the possibility of selective testing.

Other features which are considered as characteristic for the invention are set forth in the appended claims.

Although the invention is illustrated and described herein as embodied in a diagnostic circuit for measuring the resistance and leakage current of at least one firing cap of a vehicle occupant protection system for motor vehicles, and vehicle occupant protection system of corresponding configuration for motor vehicles, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
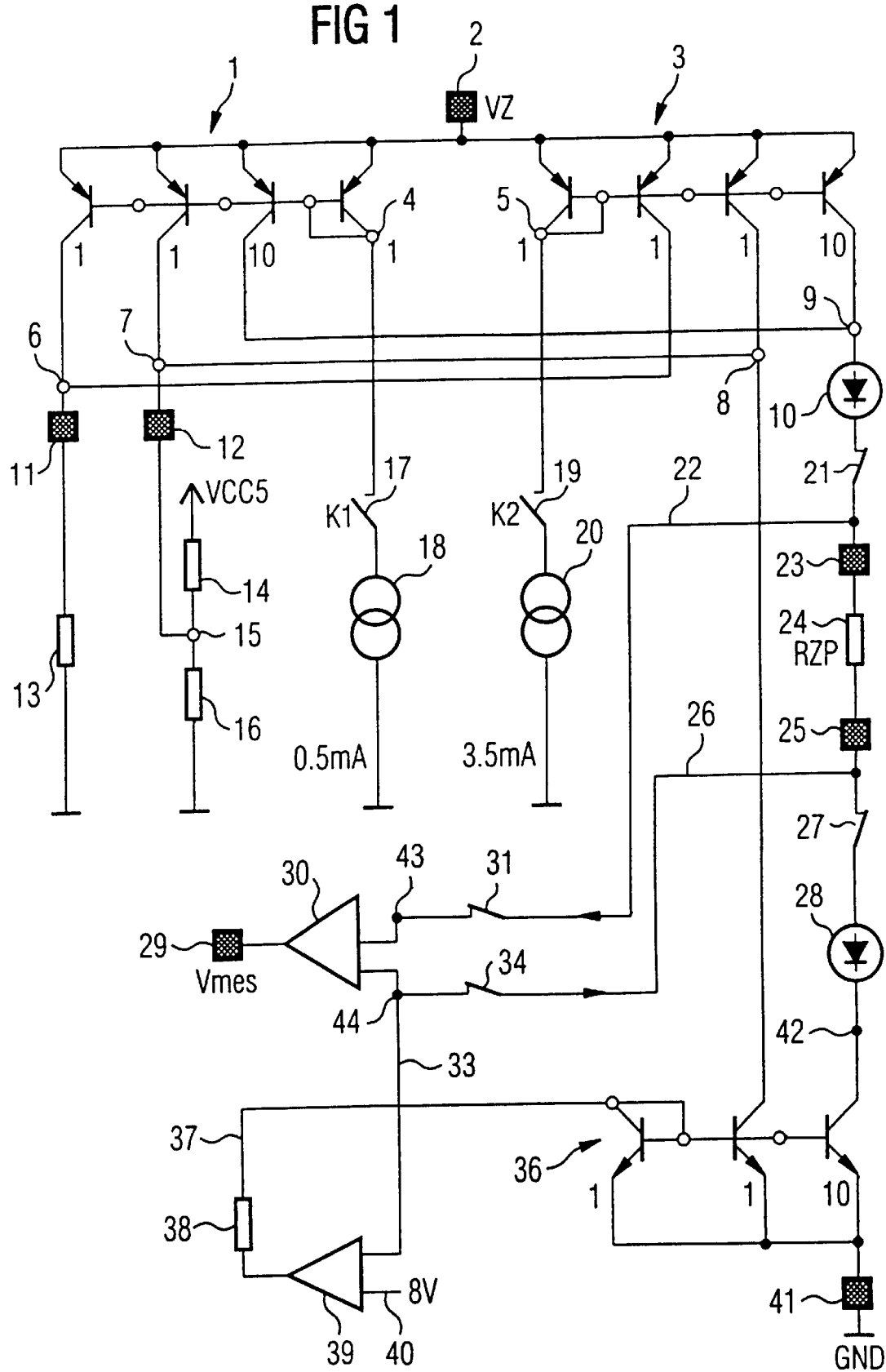
FIG. 1 hows a first embodiment electrical components including a diagnostic circuit for measuring the resistance and the leakage current of at least one firing cap of a vehicle occupant protection system.

Referring now to the figures of the drawing in detail and first, particularly, to FIG. 1 thereof, there is shown a first embodiment of a diagnostic circuit for measuring the resistance and the leakage current of at least one firing cap of a vehicle occupant protection system. The diagnostic circuit includes an electrical power supply (current mirror circuit) 1 which is composed of a plurality (in this case four) of transistors which are connected in such a way that they each respectively conduct identical or proportionally identical currents. The numerical values "1" or "10" specified for the individual transistors designate the current amplification factors, with the result that currents of identical magnitude flow in each of the transistors designated by "1", while ten times that current flows through the transistor designated by "10". All of the emitter terminals of the transistors of the electrical power supply 1 are jointly connected to a supply voltage terminal 2 to which a supply voltage VZ is applied. The control terminals of all of the transistors of the electrical power supply 1 are connected to one another internally and to a terminal 4 which is connected to a power source 18 via a switch 17. The power source 18 is used in particular for measuring leakage current and it generates a low current of, for example, 0.5 mA.

The other outputs (collectors) of the transistors of the electrical power supply are each connected independently of one another to terminals 6, 7 and 9.

A second electrical power supply (current mirror circuit) 3 is constructed in a similar way to the electrical power supply 1 and is connected to the supply voltage terminal 2 via its respective, joint emitter terminals, whereas the control terminals of the transistors of the electrical power supply 3 are each jointly connected to an output terminal 5 which can be connected to a power source 20 via a switch 19. The power source 20 generates a higher current than the power source 18, for example 3.5 mA. The other output terminals of the transistors of the electrical power supply 3 are connected separately to the terminals 6, 7 and 9, and are thus paired up with the terminals of the electrical power supply 1. Here, the two transistors connected to the terminal 9, of the electrical power supplies 1 and 3 each have the amplification factor "10", while all of the other transistors have the amplification factor "1".

The load which is to be measured is a firing cap 24 which is part of a series circuit connected between the terminal 9 and a ground terminal 41. The series circuit contains, in this sequence, a diode 10 which is connected in the conductive direction, a switch 21, the firing cap 24, which is connected between terminals 23 and 25 (for making contact and for measuring), a diode 28 whose polarity is in the conductive direction, and a transistor of a further electrical power supply 36.

A terminal 11 that serves as a measuring terminal is connected to the terminal 6. A measuring resistor 13 with a defined resistance value is connected between the terminal 11 and ground. A terminal 12 which serves as a measuring terminal, and which is connected to a tap 15 of a resistance voltage divider containing resistors 14 and 16, is likewise connected to the terminal 7. The resistors 14 and 16 which are connected in series are connected between two reference potentials, namely a reference voltage VCC5 (for example 5 V) on the one hand and ground on the other. In addition, the terminal 7 is connected to a terminal 8 which is connected to a terminal (collector) of a transistor of the electrical power supply 36, and to an output of a transistor from each of the electrical power supplies 1 and 3. The emitters of the three transistors of the electrical power supply 36 are jointly connected to the ground terminal 41, whereas their control terminals are connected to one another and to a lead 37. The transistor of the electrical power supply 36 that is connected to the firing cap 24 has an amplification factor of 10. The other transistors of the electrical power supply 36 have an amplification factor of 1, i.e. just one tenth of the current value of the transistor of the electrical power supply 36 that is connected to the firing cap 24.

In order to measure the voltage dropping across the firing cap 24, the terminals 23 and 25 are connected to a voltage detector in the form of an operational amplifier 30 via leads 22 and 26, and switches 31 and 34. The operational amplifier 30 operates as a differential amplifier which converts the voltage difference present at its input terminals 43, 44 into a corresponding output voltage which is output at a voltage measuring terminal 29.

An operational amplifier 39 is provided to regulate the voltage occurring at the input terminal 42 of the electrical power supply 36 and thus at the terminal 25. A reference voltage, for example 8 V, corresponding to the desired voltage value is applied to the input 40 of the operational amplifier 39. Through an output resistor 38 and the lead 37, the operational amplifier 39 controls the current flowing in the electrical power supply 36. The other input of the operational amplifier 39 is connected via a lead 33 to an input of the operational amplifier 30 and to the switch 34, and thus to the terminal 25.

The switches 21, 27, 31 and 34 constitute part of an analog multiplexer which has further identical switches, by means of which the circuit components (with the exception of the components 22 to 27, 31, 34) illustrated in the drawing can be successively connected to further firing caps in order to test them.

The method of operation of the circuit is explained below. In order to determine the leakage current and/or resistance of the firing cap 24, the switch Kl is initially closed so that a corresponding current, for example 0.5 mA, is impressed in the transistor connected to the terminal 4, of the electrical power supply 1. This causes a current which is ten times as high (5 mA in this example) to flow in the transistor of the electrical power supply 1 that is connected to the terminal 9. The current is supplied to the firing cap 24 via the closed switches 21 and 27. This current then flows on through the transistor (illustrated on the right) of the electrical power supply 36 which is controlled by the voltage regulator 39 in such a way that the voltage at the terminal 25 has the desired value. This current flow leads to a corresponding voltage drop at the firing cap 24 which is applied to the differential amplifier 30 via the leads 22 and 26 and the closed switches 31 and 34, and leads to a corresponding measuring voltage Vmes at the terminal 29. As a result the voltage drop across the firing cap 24 is detected. A current that is proportional to the firing cap current (ten times lower) simultaneously flows into the measuring resistor 13 via the terminal 6. The voltage occurring at the terminal 11 is measured. This voltage value is directly proportional to the firing cap current and thus represents it (voltage V at the terminal 11=(resistance value of the resistor 13)×($I_{firing\ cap}$/10)). The firing cap resistance can be determined, according to the equation R=V/I, from the voltage output at the terminal 29 representing the voltage drop across the firing cap, and from the firing cap current which can be determined from the voltage at the terminal 11. This firing cap resistance can be determined using an evaluation circuit (not shown) that is connected to the terminals 11 and 29.

At the same time as the resistance is determined, the leakage current of the firing cap can be detected with the voltage divider 14 to 16 using the voltage occurring at the terminal 12. If there is no leakage current present, the current supplied to the firing cap 24 via the terminal 9 is of the same magnitude as the current flowing through the right-hand transistor of the electrical power supply 36. The current supplied to the terminal 8 by the electrical power supply 3 and/or 1 is then completely taken up by the transistor of the electrical power supply 36 that is connected to this terminal 8. The result is that current is neither supplied to nor extracted from the voltage divider 14 to 16. The voltage at the terminal 15 is therefore, determined by the potentials VCC5 and ground and by the resistance ratio of the resistors 14 and 16. However, if a leakage current occurs, depending on whether the leakage current flows to the positive potential or to ground, an asymmetry between the current supplied to the firing cap and flowing out of it will occur. The result is that current is either fed into the voltage divider 14 to 16 or extracted from it. This leads to a corresponding potential shift at the tap 15 in an upward or downward direction, with the result that the voltage measured at terminal 12 by the evaluation circuit (not illustrated) varies correspondingly. The leakage current is directly proportional here to the voltage shift occurring at the terminal 12, according to the equation: leakage current=10$\Delta V_{12}$/(resistance value of the parallel circuit comprising the resistors 14 and 16). Here, $\Delta V_{12}$ designates the voltage deviation detected at the terminal 12 with respect to the voltage occurring in a leakage-current-free state.

Because of the small magnitude of the leakage current, which is usually only 1 to 2 mA, in order to measure the leakage current, preferably, the switch K1 is closed and the switch K2 is opened. This enables current to be supplied to the electrical power supply 1 via the power source 18, however, the electrical power supply 3 is not active. As a result, only a current which is significantly lower than that when the power source 20 is active (only about 5 mA in the example illustrated) flows through the firing cap 24. Possible leakage current losses then have a correspondingly higher proportional effect, and can consequently be better detected.

In order to increase the current when measuring the resistance, the power source 20 can subsequently be switched on by closing the switch 19, with the result that a current of 3.5 mA then flows. If the switch 17 is kept closed, overall a current of 4 mA is generated through the two power sources 18 and 20. That current is converted via the electrical power supplies 1 and 3 into a firing cap current of approximately 40 mA. The firing cap resistance can be measured in the same way as that explained above, for example in accordance with the equation $$R_{firing\ cap}=(V_{firing\ cap}\ (\text{at the terminal } 29)/(V_{terminal\ 11} \times 10)) \times R_{resistance\ 13}.$$

In order to increase the measuring accuracy further during the measurement of the resistance, the state obtained during the measurement of the leakage current (only switch 17 closed) can be taken into account in the measurement of the resistance as a second measured value. In this case, the calculation can be carried out in accordance with the equation given below:

$$R_{firing\ cap}=1/10 \times (V_{firing\ cap2}/V_{2(terminal\ 11)} - V_{firing\ cap1}/V_{1(terminal\ 11)}) \times R_{13}.$$

Here, Rfiring cap designates the firing cap resistance; $V_{firing\ cap2}$ designates the voltage value occurring at the firing cap 24 when the switches 17 and 19 are closed; $V_{2(terminal\ 11)}$ designates the voltage value occurring at the terminal 11 when the switches 17 and 19 are closed; $V_{firing\ cap1}$ designates the voltage value occurring at the firing cap 24 when the switch 17 is closed but the switch 19 is open; and $V_{1(terminal\ 11)}$ designates the voltage value occurring at the terminal 11 when the switch 17 is closed but the switch 19 is open. The difference in the equation enables the influence of the leakage current on the determination of the resistance of the firing cap to be compensated, and thus enables a very precise measurement to be performed. This measuring method at the same time also permits offset compensation. The invention consequently also makes available a corresponding measuring method with double, successive measurement with differing excitation and with the formation of a difference between measured values that have been obtained and/or intermediately calculated.

Instead of the resistance voltage divider 14 to 16, it is also possible to provide just the resistor 16 and to dispense with the resistor 14 and its connection to a reference voltage source. Furthermore, it is possible to eliminate the power source 18 or 20 together with the associated switch and associated electrical power supply in order to simplify the circuitry. In addition, instead of the electrical power supplies 1, 3 and 36, it is also possible to use current mirror circuits which conduct identical currents in all branches, or have internal proportionality factors which differ from the values 10:1 provided above.

In summary, the measuring resistor 13 and the operational amplifier 30, together with the respectively associated wiring, form a component of the resistance measuring circuit (together with the evaluation circuit which is not illustrated, that is connected to the terminals 11, 12 and 29). The voltage divider 14 to 16 forms part of the leakage current measuring circuit (together with the evaluation circuit which is not illustrated).

Figure 2:
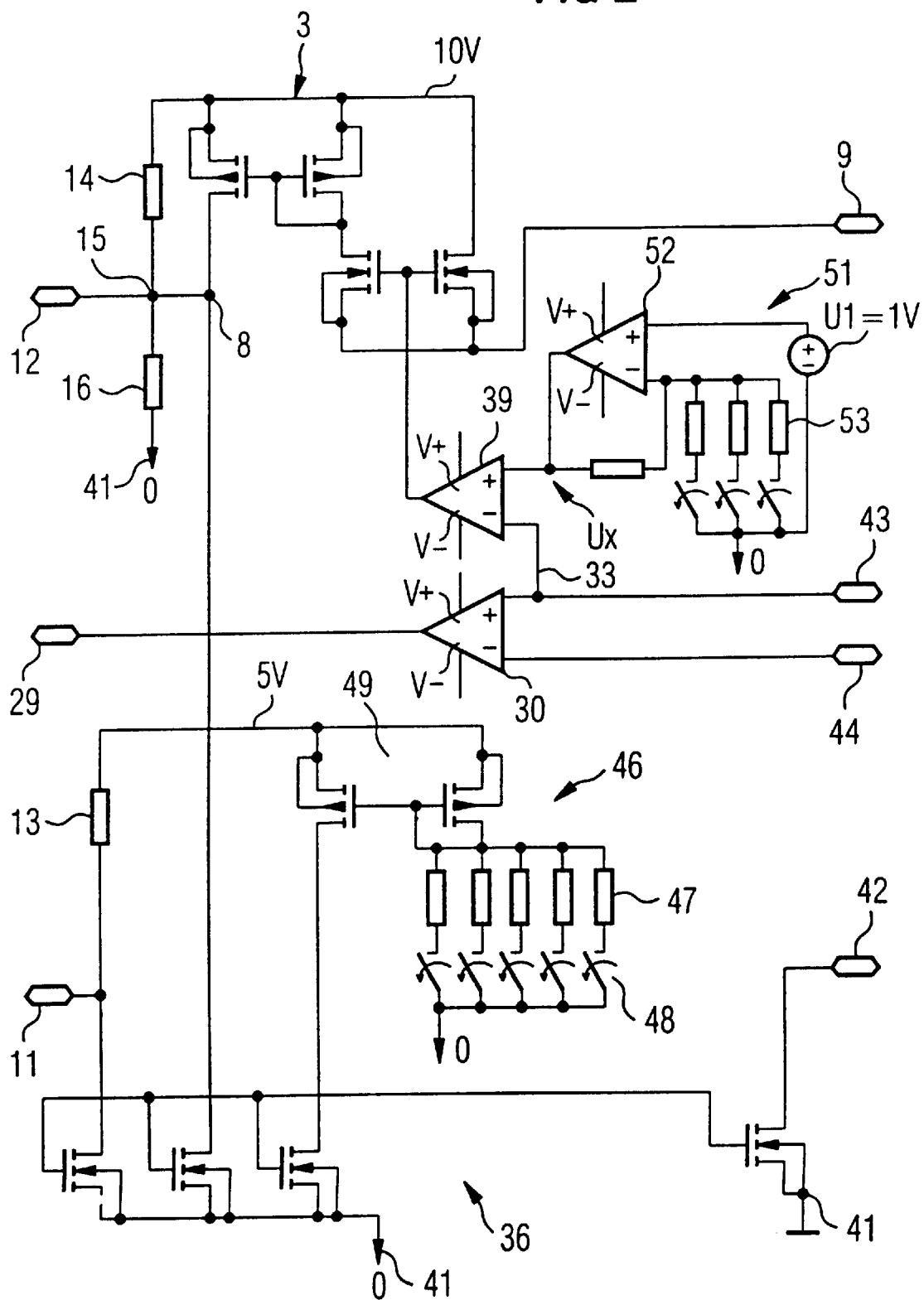
FIG. 2 shows the diagnostic circuit section of a second embodiment of electrical components for measuring the resistance and the leakage current of at least one firing cap of a vehicle occupant protection system.
Figure 3:
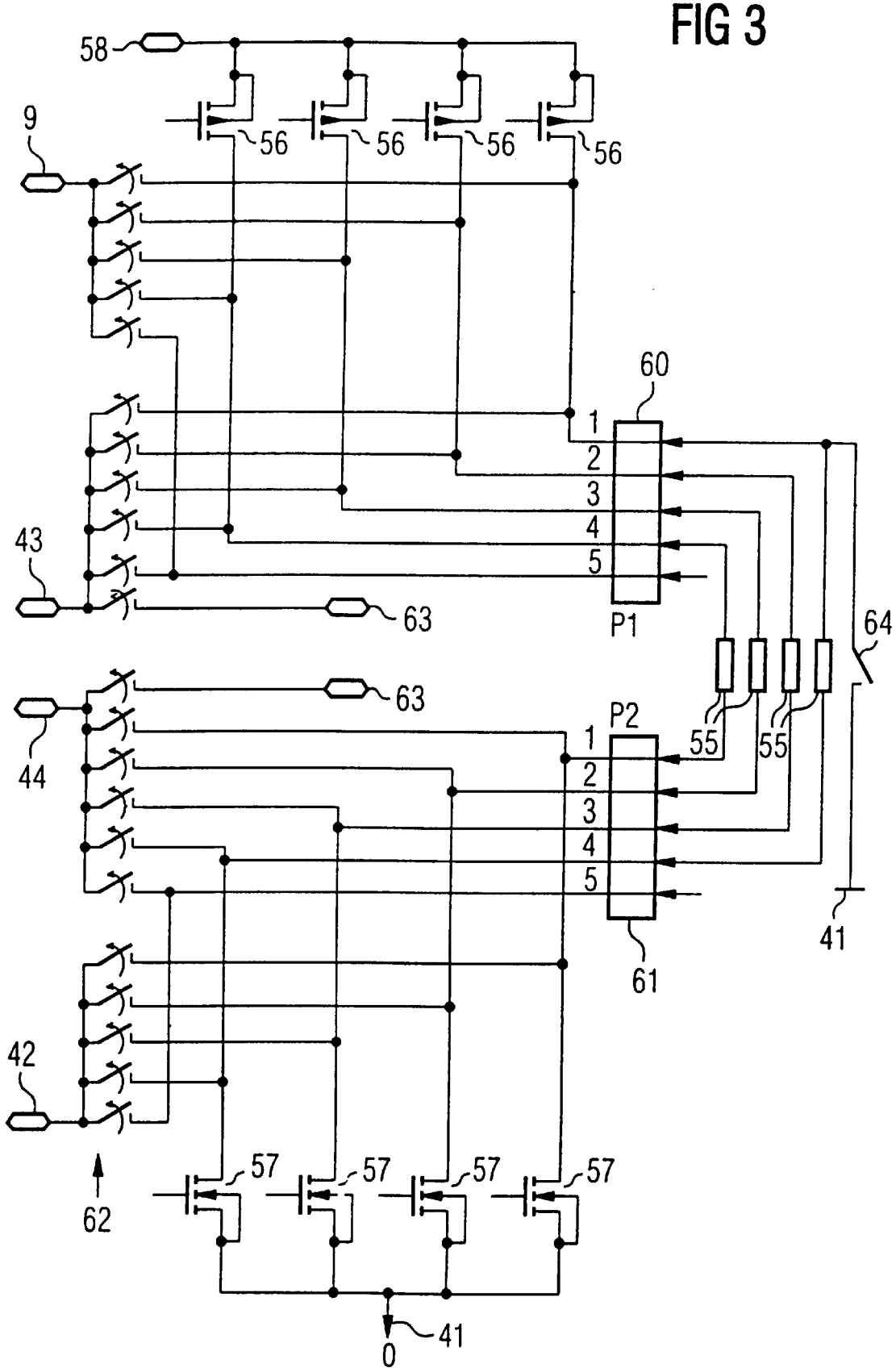
FIG. 3 shows the multiplexer section, loads to be measured, and the driver transistors of the second embodiment of the electrical components.

FIGS. 2 and 3 show a further exemplary embodiment of the electrical components of a vehicle occupant protection system for motor vehicles, which is configured according to the invention and which shows a central diagnostic circuit for measuring a multiplicity of electrical loads, in particular of firing caps and/or switches or other components which are to be monitored with respect to their resistance and/or leakage current. Those components which are identical to the components shown in FIG. 1 and/or perform the same function are not designated by the same reference symbols as in FIG. 1. With respect to these components, reference should be made to the explanations above. FIGS. 2 and 3 are to be combined in such a way that terminals 9 and 42 to 44 are respectively connected to one another so that FIG. 3 adjoins FIG. 2 from the right. FIG. 2 shows the diagnostic circuit section, while the multiplexer section, including the loads to be measured and the driver transistors is shown in FIG. 3.

In the circuit shown in FIG. 2, in contrast to the exemplary embodiment according to FIG. 1, just a single electrical power supply 3 is present on the high-level side (for example a voltage of 10 V). Furthermore, the two power sources 18 and 20 (shown in FIG. 1) have been replaced by a controllable power source circuit 46, which is configured on the low-level side (between for example 5 V and 0 V). The controllable power source circuit 46 includes a multiplicity of series circuits which are connected in parallel and include resistors 47 and switches 48. The resistors 47 may have different values or identical values. The respective resistance value present is then defined by the respective switch 48 which is switched on, or by the number of switches 48 which are switched on simultaneously. In this way the desired diagnostic current is impressed onto the current mirror circuit 49 which is fed by the electrical power supply 36. In this way, different setpoint currents can be set for measuring resistance, voltage and leakage with increased measuring accuracy. In this case, the current measuring resistor 13 is connected between the supply voltage potential for the current mirror circuit 49 and the associated FET of the electrical power supply 36. The current measuring output 11 is connected to the electrical power supply terminal of the resistor 13. A ground terminal 41 is connected to the other end of the channel of each of the FET's of the electrical power supply 36.

In the diagnostic circuit according to FIG. 2, constant voltage regulation is provided for the voltage measuring terminal 43, with the result that this terminal 43 is connected to an input of the operational amplifier 39. Its output is connected to the gate of FETs of the electrical power supply 3 in order to set the operating point onto which the diagnostic current is impressed via the current driver circuit 46, the electrical power supply 36 and the load which is to be tested. In the circuit according to FIG. 2, the constant voltage value which is impressed on the terminal 43 can be varied by a level setting circuit 51, enabling the constant voltage to be switched for different measuring range settings and/or to be varied in two or more steps during a leakage current measurement. This enables the leakage currents to be reliably detected with respect to a fixed potential, for example. The level setting circuit 51 contains a fed-back operational amplifier 52 whose amplification factor can be varied incrementally by resistors 53 which can be connected and disconnected selectively between its inverting terminal and zero potential. A fixed reference voltage of, for example, 1 V is applied to the non-inverting input of the operational amplifier 52.

In order to perform better adjustment, during fabrication, a plurality of transistors may be provided in parallel, with their gates being connected to the output of the operational amplifier 39 and thus initially forming a component of the current mirror circuit 3. In order to compensate tolerances, in an initial standardization, the field effect transistors are then selected in such a way that the high-level and low-level current mirror circuits exhibit identical characteristics. For example, when there is no leakage current, the potential at the terminals 8, 12, 15 lies precisely in the middle between the terminal potentials of the resistance voltage divider 14, 16. The transistors which are not required are then deactivated. In this way, a module-internal standardization can be performed with the result that external adjustment measures can be dispensed with.

FIG. 3 illustrates a circuit which is to be diagnosed and which contains firing caps 55 which are each connected in series between associated firing transistors 56 and 57. The firing transistors 56, 57 are connected via their other main terminals to a firing voltage terminal 58 or to ground potential. In the event of an accident, they are connected through, by a control unit which is not illustrated, to fire the respectively selected firing charge and thus to trigger the airbag, for example. The terminals of the firing caps 55 are each connected to terminals of connecting ports 60 (P1) and 61 (P2) which serve as interfaces to the components which are integrated, for example, in an ASIC and are illustrated on the left by 60, 61. Furthermore, a multiplexer 62 is provided which contains a switch bank with a multiplicity of switches for each terminal 9, 42, 43 and 44. Using the switches, the individual terminals are each simultaneously connected to a firing cap 55 which is to be tested at that particular time. All of the loads 55 etc. which are to be tested can be measured selectively one after the other by one and the same measuring circuit (for example FIG. 1 or FIG. 2), using the multiplexer 62. A measuring principle which is identical for all loads is therefore present, so that the measuring concept remains the same in all cases. The number of measuring points can be expanded as desired, with the result that it is possible not only to carry out a resistance measurement or a voltage measurement, for example, but also, switching states of external transistors, sensors, etc. can be measured and data communication is possible. The central measuring technique using just one measuring circuit and a uniform measuring principle in which the respective measuring points can be selected separately, provide the advantages of a simple sensitivity adjustment, identical tolerances for all measurements and a measuring logic which is required only once. That is to say a relatively simple circuit structure is provided. Even the adjustment of the module which carries out the measurement, for example an ASIC, is necessary only once. This concept is suitable not only for measurements with or in an ASIC, but can also be extended to any desired firing circuits or other components.

The invention also makes it possible to carry out additional measurements in a selective fashion, for example a voltage measurement on internal chip components which are connected to internal measuring terminals 63. In addition, it is possible to check, for example, the functional capability of a switch 64 which is connected to a firing cap 55 by one terminal and to a fixed potential, for example ground potential, by its other terminal. Closing the switch 64 has the same effects as a leakage current flowing in the connected firing cap 55, something which can be detected by the leakage current detection device 12, 14 to 16. The functional capability of the switch 64 can be reliably checked by reference to the magnitude of the measured, assumed leakage current and the current flow which is actually expected from the switch 64 in a correct mode of operation. In this way, for example Hall switches which are used for detecting seat belt locks may be tested with respect to their functional capability. Of course, it is also possible to test other kinds of electrical loads, or, for example, to provide the switch 64 instead of one of the firing caps 55. That is to say to connect each of the two switch terminals to an associated terminal of the connecting ports 60 and 61, so that not only current measurement but also voltage measurement can be carried out.

Figure 4A:
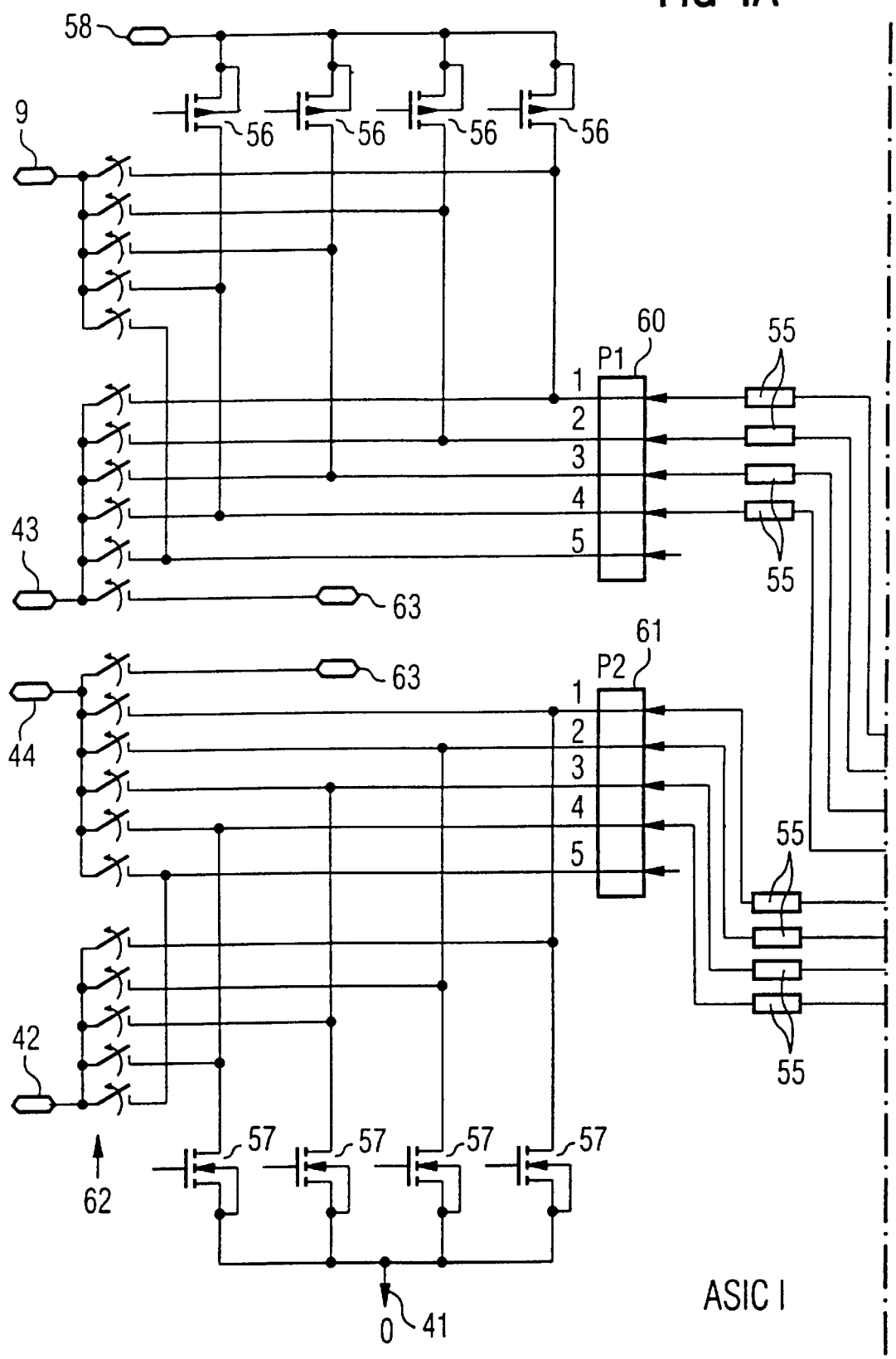
FIGS. 4a and 4B show a modified version of the multiplexer section, loads, and the driver transistors shown in FIG. 3.
Figure 4B:
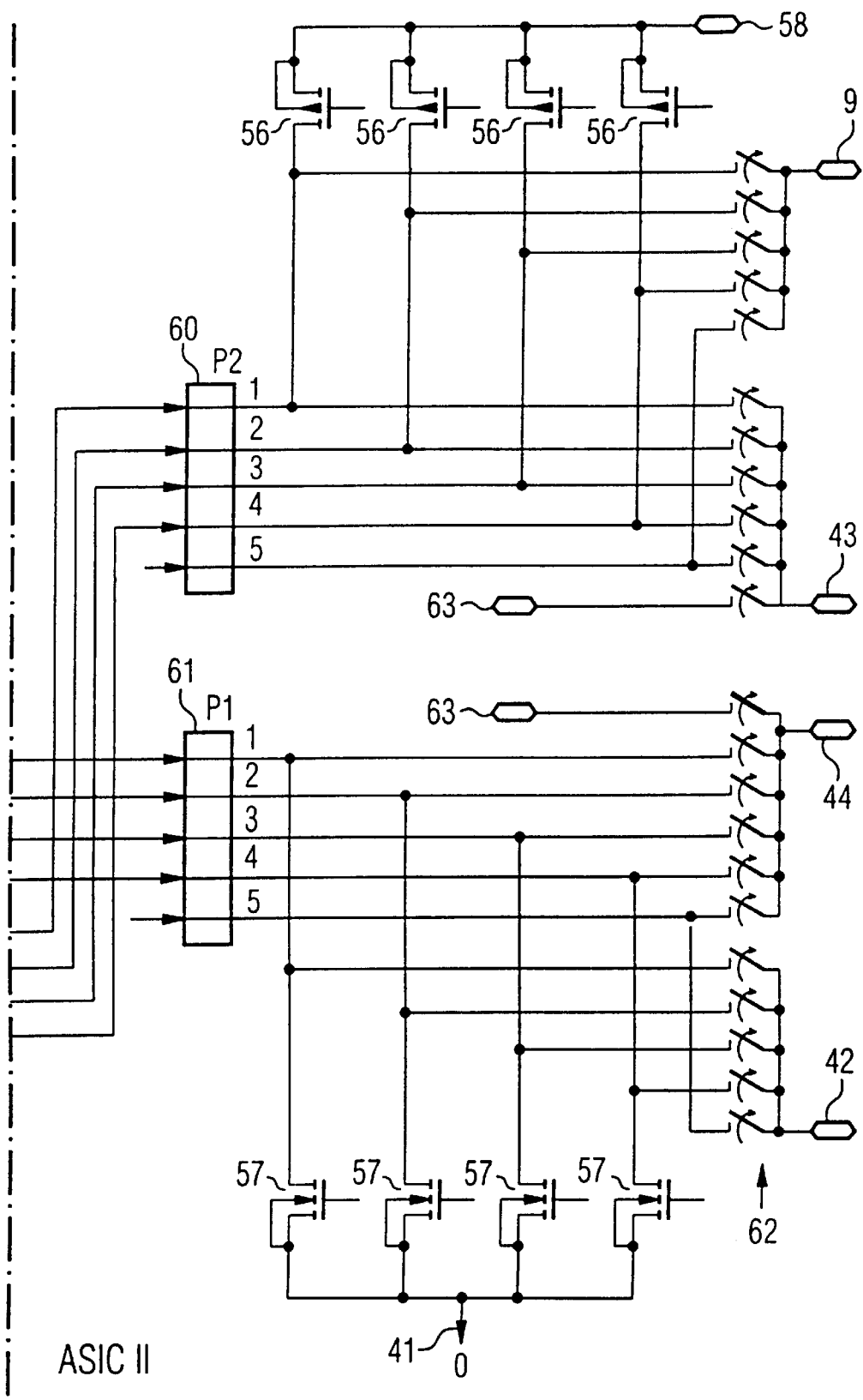

FIGS. 4A and 4B show a modified embodiment in which the firing transistor pairs of each firing cap (eight firing caps in this case) 55 are distributed among different chips, in particular ASICs. The components which are illustrated on the left of the firing caps 55 and of the left-hand connecting ports 60, 61 in FIG. 4 are configured on one chip, while the components which are shown on the right of the firing caps 55 and the right-hand connecting ports 60, 61 in FIG. 4 are configured in another chip. The connecting technique shown enables the transistors associated with a respective firing cap to be distributed between two chips, that is to say the high-level firing transistors (high side) are configured on a different module from the low-level firing transistors (low side) of the respective firing caps. In the event of a fault, for example one of the chips burning through, firing of the firing caps is reliably suppressed because the other end stage which is necessary for firing the respective firing caps is configured on the other chip. The individual components shown in FIG. 4 correspond to the components which have already been explained with reference to FIG. 3 and are provided with identical reference symbols, so that reference is made to the description above.

As is apparent, each chip is equipped with a multiplexer 62. The measuring terminals 9, 42, 43, 44 are connected, such that they are respectively isolated from one another. The measuring terminals 9, 42, 43, 44 are connected to the measuring circuit shown in FIGS. 1 or 2, in such a way that the diagnostic current supplied, for example, via the measuring terminal 9 (illustrated top left) of the left-hand chip is output at the terminal 42 of the chip illustrated on the right, after flowing through the selected firing cap, and is passed on to the measuring circuit. The same also applies to the other terminals. The control of the multiplexers 62 is preferably configured in such a way that when a measurement is carried out, the switches of the upper half of the multiplexer 62 illustrated on the left are operated synchronously with the switches of the lower half of the multiplexer 62 illustrated on the right. This is in order to measure the four upper measuring caps 55, while, during this process, the lower half of the left-hand multiplexer 62 and the upper half of the multiplexer 62 illustrated on the right remain unactivated. That is to say the switches are kept open. When the four lower firing caps 55 are measured, the conditions are reversed, that is to say the lower left-hand and upper right-hand halves of the multiplexer 62 are activated, while the other multiplexer sections remain unactivated.

Figure 5:
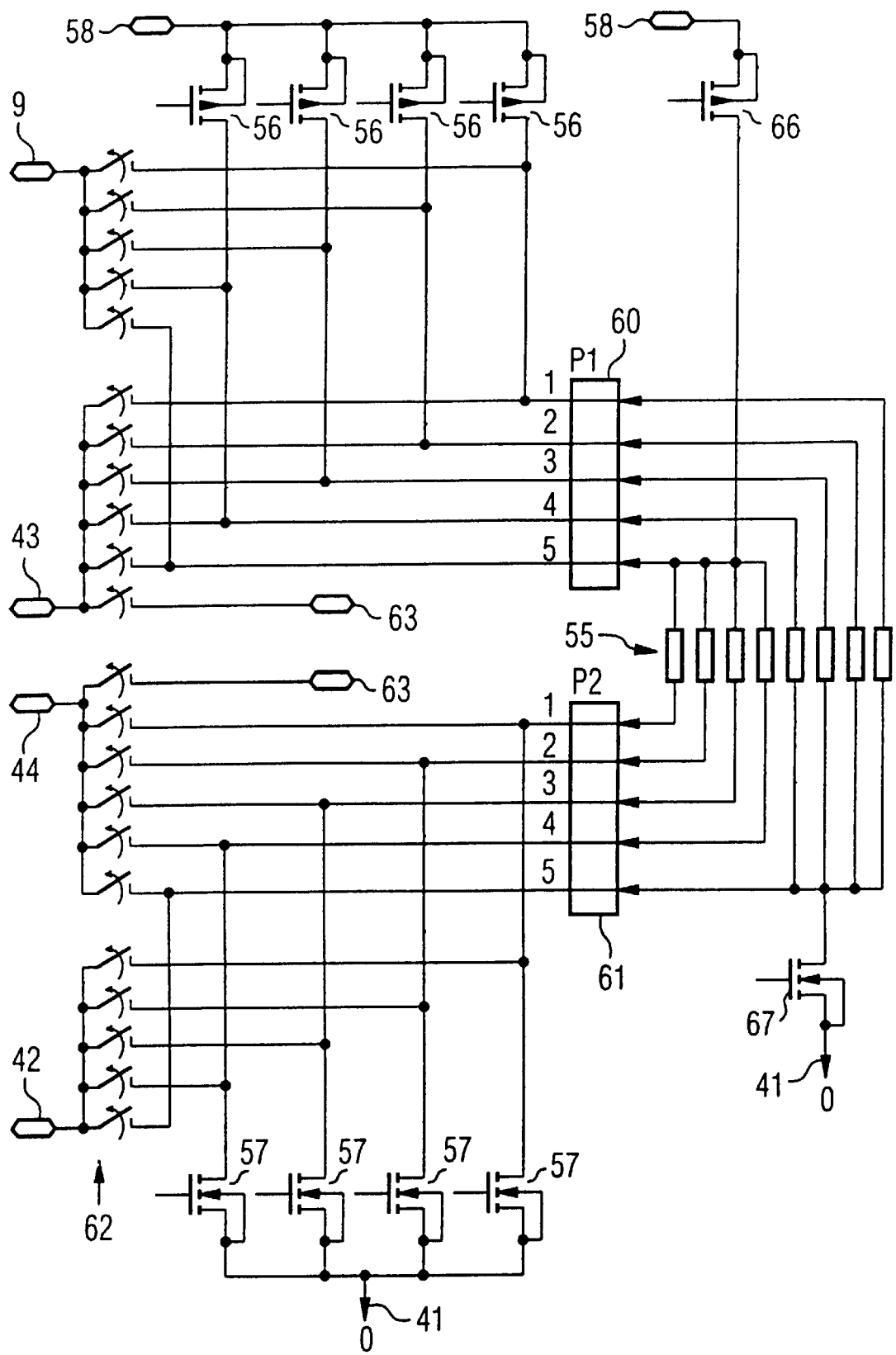
FIG. 5 shows another modified version of the multiplexer section, loads, and the driver transistors shown in FIG. 3.

FIG. 5 illustrates a further exemplary embodiment which permits the number of firing caps which are to be measured and fired to be increased with only a slight additional expenditure in terms of circuitry. The components illustrated to the left of the connecting ports 60, 61 in FIG. 5 are identical to the components shown in FIG. 3 and already described there. Instead of the four firing caps 55 shown in FIG. 3, in the exemplary embodiment according to FIG. 5 eight firing caps 55 can be measured and driven. For this purpose, four of the firing caps 55 are connected together at one of their terminals and connected by this common terminal to a terminal of the connecting port 60 and to a common firing transistor 66. The other terminals of these four firing caps are connected separately via the connecting port 61 to respective separate firing transistors 57. In order to fire one of these firing caps, the firing transistor 66 and at the same time the firing transistor 57 which is assigned to this firing cap are connected through. In order to perform diagnostic measurement, the multiplexer 62 is connected in such a way that the diagnostic current is supplied to the common firing cap terminal. The diagnostic current can flow to the measuring circuit only via the firing cap selected at that particular time and the assigned switch of the switch bank connected to the terminal 42 of the multiplexer 62.

The firing transistor 66 can be embodied as an external firing transistor, but may also be provided in the same module as the firing transistors 56, 57.

In the same way, the low-level terminals of the four firing caps 55 which are illustrated on the right are combined and connected to a common terminal of the connecting port 61 and a firing transistor 67, via which they can be connected to zero potential when firing occurs. The four high-level terminals of the four firing caps 55 which are illustrated on the right are selectively connected to respective separate terminals of the connecting port 60 so that a selective diagnostic capability and firing is also possible for these firing caps. The firing transistor 67 can also be embodied as an external firing transistor or else as a component of the chip containing the firing transistors 57. In order to fire eight firing caps selectively, just ten power transistors are consequently required and the selective measuring and triggering capability is not lost. This permits a simple circuit design. At the same time, the measuring circuit (FIG. 1, FIG. 2) can be used to measure, in this case, eight firing caps so that a very good utilization factor is achieved, that is to say, the entire expenditure on circuitry is relatively low.

We claim:

1. A diagnostic circuit for measuring resistance and leakage current for at least-one firing cap of a motor vehicle occupant protection system, comprising:
    a terminal for receiving a reference potential;
    at least one load having two terminals, one of said two terminals of said at least one load connected to said terminal for receiving a reference potential;
    an activation circuit for feeding a current to said at least one load during a diagnostic measurement;
    a resistance measuring circuit for determining a resistance of said at least one load;
    a leakage current measuring circuit for determining a leakage current that may be flowing during the diagnostic measurement, said leakage current measuring circuit configured to measure a difference between the current fed to said at least one load by said activation circuit and a current flowing from said at least one load to said terminal for receiving a reference potential, said leakage current measuring circuit being operated at the same time as said resistance measuring circuit; and
    a plurality of electrical power supplies connected to said leakage current measuring circuit and to said two terminals of said at least one load.

2. The diagnostic circuit according to claim 1, wherein said leakage current measuring circuit includes a resistive voltage divider for connection between two reference potentials, said resistive voltage divider includes a tap, and said leakage current measuring circuit is configured to measure a voltage at said tap of said resistive voltage divider which is indicative of a leakage current.

3. The diagnostic circuit according to claim 2, comprising a voltage regulator connected to one of said plurality of said electrical power supplies, said one of said plurality of said electrical power supplies assigned to said one of said two terminals of said at least one load, said voltage regulator configured to regulate a voltage occurring at said one of said two terminals of said at least one load to a specific value.

4. The diagnostic circuit according to claim 3, wherein said voltage regulator is configured to adjust said specific value.

5. The diagnostic circuit according to claim 1, wherein:
    said activation circuit includes a power source configured for activation during the diagnostic measurement and for providing different power values;
    said activation circuit includes at least one of said plurality of said electrical power supplies; and
    said one of said plurality of said electrical supplies of said activation circuit has a plurality of separate output terminals connected to and supplying currents of fixed proportional relationships to: said power source, said at least one load, said resistance measuring circuit, and to said leakage current measuring circuit.

6. The diagnostic circuit according to claim 5, wherein said currents supplied by said one of said plurality of said electrical supplies of said activation circuit have magnitudes that are equal to each other.

7. The diagnostic circuit according to claim 5, wherein current difference measured by said leakage current measuring circuit is performed at a power level that is lower than that at which a resistance measurement is performed using said resistance measuring circuit.

8. The diagnostic circuit according to claim 1, wherein said activation circuit and said leakage current measuring circuit are configured for performing two resistance measurements with respectively different magnitudes of current being fed to said at least one load.

9. The diagnostic circuit according to claim 8, wherein results of said two resistance measurements are used to form a difference to compensate for leakage current.

10. The diagnostic circuit according to claim 8, wherein results of said two resistance measurements are used to form a difference for offset compensation.

11. The diagnostic circuit according to claim 1, comprising a multiplexer having switches connected in series with said at least one load.

12. The diagnostic circuit according to claim 11, comprising:
    a voltage regulator connected to one of said plurality of said electrical power supplies, said one of said plurality of said electrical power supplies assigned to said one of said two terminals of said at least one load, said voltage regulator configured to regulate a voltage occurring at said one of said two terminals of said at least one load to a specific value;
    said leakage current measuring circuit including a resistive voltage divider for connection between two reference potentials, said resistive voltage divider including a tap, said leakage current measuring circuit configured to measure a voltage at said tap of said resistive voltage divider which is indicative of a leakage current;
    said resistance measuring circuit having a voltage detector for detecting voltages and having switches, said voltage detector having a terminal connected to said voltage regulator; and
    said multiplexer configured for selectively controlling said switches to connect said voltage detector to said two terminals of said at least one load.

13. The diagnostic circuit according to claim 1, wherein said terminal for receiving a reference potential is connected to a ground potential.

14. A motor vehicle occupant protection system, comprising:
    a terminal for receiving a reference potential;
    at least one load having two terminals, one of said two terminals of said at least one load connected to said terminal for receiving a reference potential;
    an activation circuit for feeding a current to said at least one load during a diagnostic measurement;
    a resistance measuring circuit for determining a resistance of said at least one load;

a leakage current measuring circuit for determining a leakage current that may be flowing during the diagnostic measurement, said leakage current measuring circuit configured to measure a difference between the current fed to said at least one load by said activation circuit and a current flowing from said at least one load to said terminal for receiving a reference potential;

a plurality of electrical power supplies connected to said leakage current measuring circuit and to said two terminals of said at least one load;

a first integrated circuit including a first plurality of switching elements; and a second integrated circuit including a second plurality of switching elements;

said at least one load including a plurality of firing caps, each one of said plurality of said firing caps connected between a respective one of said first plurality of said switching elements and a respective one of said second plurality of said switching elements, each one of said plurality of said firing caps connected to fire when said respective one of said first plurality of said switching elements and said respective one of said second plurality of said switching elements are closed.

15. A motor vehicle occupant protection system, comprising:

a terminal for receiving a reference potential;

at least one load having two terminals, one of said two terminals of said at least one load connected to said terminal for receiving a reference potential;

an activation circuit for feeding a current to said at least one load during a diagnostic measurement;

a resistance measuring circuit for determining a resistance of said at least one load;

a leakage current measuring circuit for determining a leakage current that may be flowing during the diagnostic measurement, said leakage current measuring circuit configured to measure a difference between the current fed to said at least one load by said activation circuit and a current flowing from said at least one load to said terminal for receiving a reference potential;

a plurality of electrical power supplies connected to said leakage current measuring circuit and to said two terminals of said at least one load;

a first integrated circuit including a first plurality of switching elements;

a second integrated circuit including a second plurality of switching elements;

a common switching element; and a plurality of switching elements;

said at least one load including a plurality of firing caps, each one of said plurality of said firing caps having a first terminal and a second terminal, said first terminals of at least some of said plurality of said firing caps connected together and driven by said common switching element, each one of said second terminals of said at least some of said plurality of said switching elements individually connected to a respective one of said plurality of said switching elements.

* * * * *